United States Patent
Lindell et al.

(10) Patent No.: US 10,622,170 B2
(45) Date of Patent: Apr. 14, 2020

(54) THREE-PHASE CIRCUIT BREAKER WITH PHASE SPECIFIC SWITCHING

(71) Applicant: ABB Schweiz AG, Baden (CH)

(72) Inventors: Elisabeth Lindell, Västerås (SE); Lars Liljestrand, Västerås (SE); Stefan Halén, Västerås (SE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/480,577

(22) PCT Filed: Jan. 29, 2018

(86) PCT No.: PCT/EP2018/052114
§ 371 (c)(1),
(2) Date: Jul. 24, 2019

(87) PCT Pub. No.: WO2018/141684
PCT Pub. Date: Aug. 9, 2018

(65) Prior Publication Data
US 2019/0371542 A1  Dec. 5, 2019

(30) Foreign Application Priority Data

Feb. 2, 2017 (EP) ..................... 17154305

(51) Int. Cl.
*H01H 9/56* (2006.01)
*G01R 19/165* (2006.01)
(Continued)

(52) U.S. Cl.
CPC .......... *H01H 9/563* (2013.01); *G01R 19/165* (2013.01); *H01H 33/60* (2013.01); *H01H 71/12* (2013.01)

(58) Field of Classification Search
CPC .................. G01R 19/165; G04F 10/10; H01H 2009/566; H01H 33/593; H01H 33/60;
(Continued)

(56) References Cited

U.S. PATENT DOCUMENTS

| 4,356,525 A | * | 10/1982 | Kornrumpf | ............ | H02H 9/002 |
| | | | | | 361/4 |
| 5,563,459 A | * | 10/1996 | Kurosawa | ................ | H01H 9/56 |
| | | | | | 307/141.4 |

(Continued)

FOREIGN PATENT DOCUMENTS

| EP | 2629314 A1 | 8/2013 |
| EP | 3125264 A1 | 2/2017 |
| GB | 2090702 A | 7/1982 |

OTHER PUBLICATIONS

International Preliminary Report on Patentability Application No. PCT/EP2018/052114 Completed: Mar. 6, 2019; dated Mar. 6, 2019 10 pages.

(Continued)

*Primary Examiner* — Thienvu V Tran
*Assistant Examiner* — Nicolas Bellido
(74) *Attorney, Agent, or Firm* — Whitmyer IP Group LLC

(57) ABSTRACT

A method for controlling a circuit breaker, the circuit breaker is connected in a three-phase system having an inductive load, and the method includes a method for controlling a circuit breaker, the circuit breaker being connected in a three-phase system having an inductive load, the method includes opening a first phase of the three-phase system before a zero crossing of a current in the first phase, opening the second and third phases of the three-phase system a quarter period after opening the first phase, closing the first and second phase at a peak voltage of a voltage between the first and second phases, and closing the third phase a quarter period after closing the first and second phases. A circuit breaker controller is also presented.

4 Claims, 5 Drawing Sheets

(51) Int. Cl.
    *H01H 33/60*    (2006.01)
    *H01H 71/12*    (2006.01)
(58) Field of Classification Search
    CPC ...... H01H 33/66; H01H 33/664; H01H 71/12;
        H01H 9/542; H01H 9/56; H01H 9/563;
        H02B 1/26; H02B 1/28; H02B 13/00;
        H02H 3/021; H02H 7/04; H02H 7/0455;
        H02H 9/002; H03K 17/13; H03K 17/16;
            H03K 17/28; H03K 17/723; H03K
                                           17/725
    See application file for complete search history.

(56)            References Cited

U.S. PATENT DOCUMENTS 6,493,203  B1    12/2002  Ito et al.
    6,693,777  B1     2/2004  Cereda et al.
    9,252,589  B2 *   2/2016  Kai .................... H02H 7/04
   10,242,826  B2 *   3/2019  Lindell ............... H01H 33/593
 2008/0164962  A1 *   7/2008  Koyama ............... H01H 9/563
                                                          335/20
 2012/0236443  A1     9/2012  Kinoshita et al.
 2013/0163125  A1     6/2013  Udagawa et al.

OTHER PUBLICATIONS

International Search Report and Written Opinion of the International Searching Authority Application No. PCT/EP2018/052114 Completed: May 25, 2018; dated Jun. 5, 2018 8 pages.

* cited by examiner

| Delayed phase | $L_1$ | $L_3$ | $L_3$ | $L_2$ | $L_2$ | $L_1$ |
|---|---|---|---|---|---|---|
| Main voltage peak value | $L_2$-$L_3$, pos. | $L_1$-$L_2$, neg. | $L_1$-$L_2$, pos. | $L_3$-$L_1$, pos. | $L_3$-$L_1$, neg. | $L_2$-$L_3$, neg. |
| Approx peak inrush current [A] | 45 | < 2 | 31 | 21 | 56 | 35 |
| Approx peak phase-to-ground voltage [kV] | 28 | 26 | 27 | 26 | 27 | 27 |
| Approx peak phase-to-phase voltage [kV] | 36 | 34 | 35 | 33 | 35 | 38 |

Fig. 6

| Delayed phase | $L_1$ | $L_3$ | $L_3$ | $L_2$ | $L_2$ | $L_1$ |
|---|---|---|---|---|---|---|
| Main voltage peak value | $L_2$-$L_3$, pos. | $L_1$-$L_2$, neg. | $L_1$-$L_2$, pos. | $L_3$-$L_1$, pos. | $L_3$-$L_1$, neg. | $L_2$-$L_3$, neg. |
| Approx peak inrush current [A] | 5 | < 2 | 26 | < 2 | 13 | 11 |
| Approx peak phase-to-ground voltage [kV] | 26 | 27 | 25 | 28 | 27 | 28 |
| Approx peak phase-to-phase voltage [kV] | 36 | 35 | 35 | 34 | 34 | 37 |

Fig. 7

THREE-PHASE CIRCUIT BREAKER WITH PHASE SPECIFIC SWITCHING

TECHNICAL FIELD

The invention relates to a method for controlling a circuit breaker, and a circuit breaker controller.

BACKGROUND

Control of circuit breakers has been utilized in different ways for long time. Several solutions on how to do it in order to reach different benefits have been presented, e.g. how to open a circuit breaker in an optimal way or how to close a circuit breaker in an optimal way, how to minimize erosion of breaker contacts and how to minimize inrush current. This is mainly used at high voltage level and higher.

U.S. Pat. No. 6,493,203 describes a phase control switch apparatus incorporating a phase-based break/make controller for protecting a reactive load such as a transformer.

EP 3125264 describes an electric power distribution switchgear for synchronized breaking of a current.

GB 2090702 describes closing of a third phase 80 degrees after closing of the two other phases in a hybrid contractor.

SUMMARY

At disconnection of inductive loads, severe transient over voltages may occur. This is a phenomenon that is gaining more and more attention, as applications where switching is performed much more frequently than before are arising. It has also been noted that in particular dry type of transformers should be sensitive to switching over voltages.

An object of the present invention is to enable improved control of a circuit breaker for three-phase systems.

According to a first aspect, there is presented a method for controlling a circuit breaker. The circuit breaker is connected in a three-phase system having an inductive load, and the method comprises opening a first phase of the three-phase system before a zero crossing of a current in the first phase, opening the second and third phases of the three-phase system a quarter period after opening the first phase, closing the first and second phase at a peak voltage of a voltage between the first and second phases, and closing the third phase a quarter period after closing the first and second phases.

The method may comprise measuring the current in the first phase, and measuring the voltage between the first phase and the second phase.

The method may comprise estimating the current in the first phase by measuring a phase voltage, and measuring the voltage between the first phase and the second phase.

The first phase may be opened a quarter period before the zero crossing of the current in the first phase.

The first phase may be opened before a zero crossing towards a positive current in the first phase, and wherein the first and second phases are closed at a negative peak voltage of phase-to-phase voltage between the first and second phases.

The first phase may be opened before a zero crossing towards a negative current in the first phase, and wherein the first and second phases are closed at a positive peak voltage of phase-to-phase voltage between the first and second phases.

According to a second aspect, there is presented a circuit breaker controller for a three-phase system having an inductive load. The circuit breaker controller comprises a circuit breaker controller configured to measure a first phase current in the three-phase system, open the first phase of the three-phase system, open a second and third phase of the three-phase system after opening the first phase, measure a phase-to-phase voltage between the first phase and the second phase, close the first and second phase, and close the third phase after closing the first and second phases.

The circuit breaker controller may be configured to open the first phase a quarter period before a zero crossing of the current in the first phase.

The second and third phases may be opened a quarter period after opening of the first phase, and wherein the third phase may be closed a quarter period after the first and second phases are closed.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which:

FIG. 6 is a table of closing of phases during no load, after opening during no load;

FIG. 7 is a table of closing of phases during no load, after opening during load;

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

The present invention includes that disconnection of an inductive load, with a power factor of $0 \leq pf < 1$, in order to prevent severe transient over voltages, should be combined with subsequent energizing in an optimal way, in order to also minimize inrush current. By knowing the history from the former disconnection event, energizing can be performed in an optimal way.

The present invention both significantly reduces the transient over voltages at disconnection of an inductive load such as a transformer by opening of a circuit breaker, and in an optimal way energizes a transformer at closing of the circuit breaker. This limit the stresses on the equipment connected to the system (such as transformers) and minimizes the inrush current, which also leads to a decrease of stress and makes the system reach steady state more quickly. An aim is to keep the inrush current at a nominal load current or lower.

Figure 1:
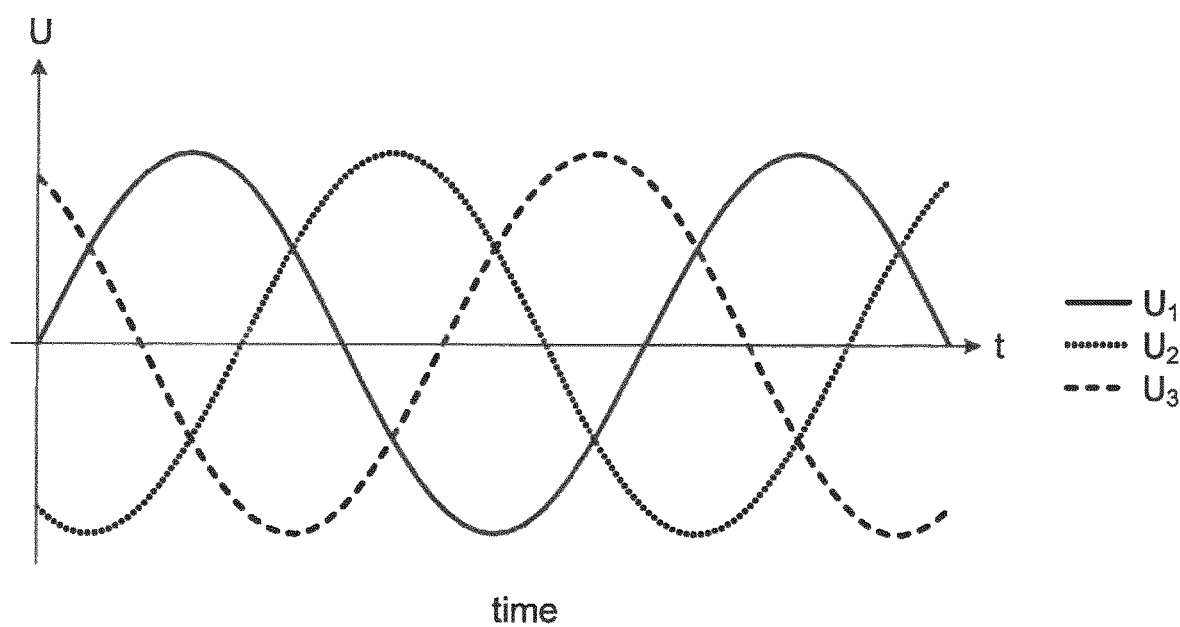
FIG. 1 schematically illustrates phase sequence in a three phase system.

The present invention is used in a three phase system. A phase sequence of a three phase system is illustrated in FIG. 1. A first phase is defined as $L_1$, having a voltage $U_1(t)=U \sin(\omega t)$, a second phase is defined as $L_2$, having a voltage $U_2(t)=U \sin(\omega t-2\pi/3)$, and a third phase is defined as $L_3$, having a voltage $U_3(t)=U \sin(\omega t-4\pi/3)$.

Figure 2:
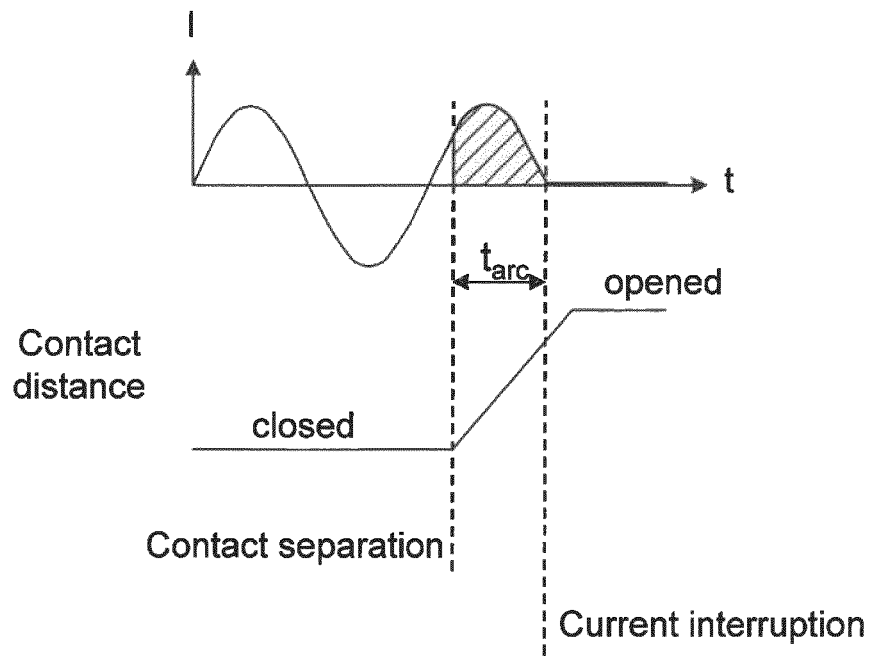
FIG. 2 schematically illustrates a long arcing time in a circuit breaker.
Figure 3:
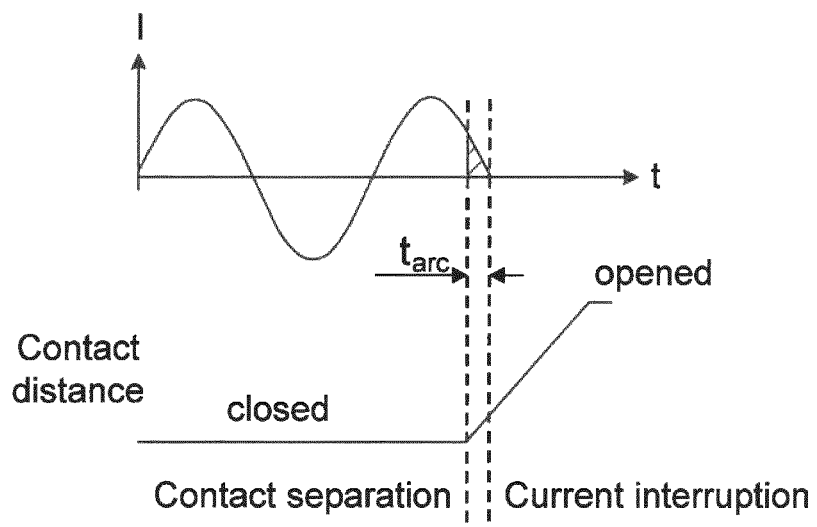
FIG. 3 schematically illustrates a short arcing time in a circuit breaker.

Opening of a circuit breaker will initially provide contact separation, which will ignite an arc if the current is above a current chopping level. If the current is below a current chopping level, the current will be interrupted immediately. An ignited arc will be interrupted thereafter at a current zero crossing or more precisely shortly prior to the current zero crossing in case current chopping occurs. Contact separation and current interruption is illustrated in FIGS. 2 and 3. In FIG. 2 a long arcing time is illustrated, which will provide a sufficient contact distance at current interruption preventing re-ignition. In FIG. 3 a short arcing time is illustrated, which will give a too short contact distance at current interruption, which will risk re-ignition. In this description, opening of a circuit breaker means contact separation.

An advantage with the presented method is e.g. that no residual flux detection unit is needed in connection with a transformer with an iron core.

The circuit breaker is in an embodiment used for a medium voltage (MV) circuit breaker (CB), i.e. for 1-71 kV three phase systems.

Energizing of a transformer could cause inrush currents depending on phase angle at closing of a circuit breaker and remanent flux in the transformer. There are at least four degrees of freedom to consider:
1. to select the order of opening of the phases;
2. to select which current zero crossing to use for opening;
3. to select which voltage peak to use for closing, positive or negative; and
4. to select the order of closing of the phases.

Unlike ordinary MV circuit breakers, synchronized opening is used and always interrupts:
1. in the same order between the phases; and
2. at known signs (positive or negative) of a current before a current zero crossing thereof.

One result is that the sign of the remanent flux in an inductive load with an iron core is known, such as in each leg of a transformer core.

The inrush currents, which will occur in an inductive load during energizing, may therefore be minimized by:
1. knowing the sign of the remanent flux in each leg of the inductive load core; and
2. selecting the voltage peak for the circuit breaker closing instant.

Although the above has supposed an AC system, wherein an arc will ignite during opening, the presented system will be useful also in other applications such as other types of breakers and coupling devices such as power electronic based breakers.

Figure 4:
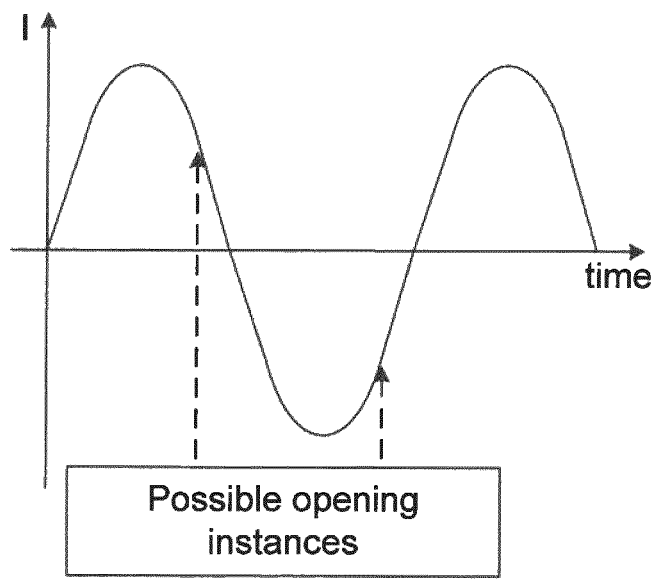
FIG. 4 schematically illustrates possible opening instances in a phase.
Figure 9:
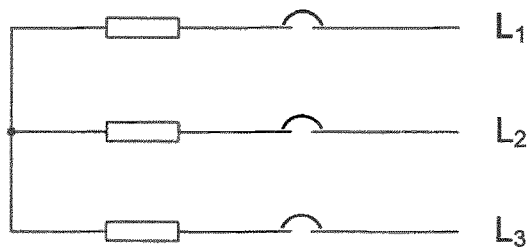
FIG. 9 schematically illustrates a three-phase system with circuit breakers according to an embodiment.

A break/make three phase system (without ground) will be described with reference to FIG. 9. The first phase which is opened during breaking is called $L_1$. The first phase $L_1$ may be an arbitrary phase of the three phases of the three-phase system. It is desirable to open the phase $L_1$ before a zero crossing of the current in the phase, to minimize over voltage in the system. Opening of the phase should be initiated sufficiently long before the current interruption, such that the circuit breaker has had time to achieve contact separation before the current interruption. Contact separation is preferably achieved at least 1 ms before the current interruption. Possible opening instances are illustrated in FIG. 4, and the time windows from the marked "possible opening instances" until the next current zero crossing should be avoided, and the contact separation should occur in the time window before the marked "possible opening instances" and previous current zero crossing. To ensure that an arc does not reignite after the zero crossing, contact separation is more preferably made before the zero crossing with a security margin of a quarter period i.e. 5 ms for a 50 Hz system. By opening a contact in the middle between two zero crossings, re-ignition is prevented with a security margin. An arc will however ignite at initial opening of the circuit breaker contacts, but it will be extinguished at the following zero crossing.

The current has a half period (between two zero crossings) of $\pi$ radians, and opening is thus preferably made at half that period at $\pi/2$ before a desired zero crossing. For a 50 Hz system this corresponds to about 5 ms.

After the $L_1$ phase has been opened, the $L_2$ and $L_3$ phases are opened at the same time, a quarter period later. After the current has been interrupted in the first phase, the two remaining phases end up having the same current (however in opposite direction), and opening only one phase will provide the same result. It is thus not important that the two remaining phases are open exactly simultaneously.

Opening or breaking a three-phase system, having an inductive load, as presented herein is based on manually triggered openings, allowing delay of opening until an optimal time. During a short circuit controlled opening is bypassed, and this situation is not relevant for the presented solution.

To determine the optimal opening point of time, the current of the phase $L_1$ is measured. A next zero crossing of the current of phase $L_1$ is detected, and a sufficient time offset is added, such that the offset time and the time it takes for the circuit breaker to achieve contact separation together gives contact separation at the optimal time instant. Opening of the phases $L_2$ and $L_3$ is made thereafter.

Figure 5:
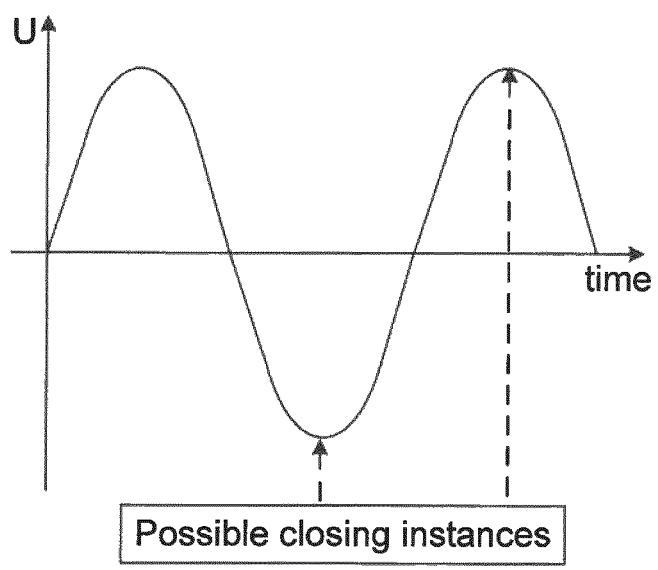
FIG. 5 schematically illustrates possible closing instances.

When the system is to be started again, the breaker contacts are to be closed in a predetermined way, to minimize inrush currents. In this case a voltage over $L_1$ and $L_2$ is measured to find the optimal closing point of time, which is dependent on the previous opening of the breaker contacts. It is desirable to close the phases $L_1$ and $L_2$ at a peak of the voltage there over, to minimize inrush currents in the system. Possible closing instances are illustrated in FIG. 5. Only closing one phase will not create a closed circuit, and only after closure of two phases the system is partly closed again. The optimal closing point of time is at the negative peak of the voltage over phases $L_1$ and $L_2$, when opening has been performed on a negative half-period of the current through $L_1$. Measurement to determine this point of time may be made.

To minimize inrush currents, after initiating opening through the $L_1$ phase, phases $L_1$ and $L_2$ are closed by making the corresponding breakers poles. The last phase $L_3$ is closed a quarter period later.

Opening of the circuit breaker can occur e.g. for a loaded transformer or for an idle transformer, but closing should be made for a transformer in idle mode.

Tests have been made for peak inrush current, which is illustrated in FIGS. 6 and 7. Tests shown in FIG. 6 were performed for closing during no load, after opening during no load. As can be seen the peak inrush current is clearly the lowest for $L_3$ being the delayed phase after closing of phases $L_1$ and $L_2$ at a negative peak of phase-to-phase voltage $L_1$-$L_2$, provided that the phases were opened in the order described above (i.e. phase $L_1$ opened first followed by opening of phases $L_2$ and $L_3$). The order of closing the phases being dependent on the order of opening the phases, i.e. delaying closing of $L_3$ when $L_1$ has been opened first minimize inrush current. Tests shown in FIG. 7 were performed for closing during no load, after opening during load. Also for his case, delaying closing of $L_3$ after closing of $L_1$ and $L_2$ at a negative peak of phase-to-phase voltage $L_1$-$L_2$ the peak inrush current is one of the lowest. Delaying $L_2$ after closing of $L_1$ and $L_3$ at a positive peak of phase-to-phase voltage $L_3$-$L_1$, is equally low. The order of closing the phases being dependent on the order of opening the phases, i.e. delaying closing of $L_3$ or $L_2$ when $L_1$ has been opened first minimize inrush current. By selecting to delay $L_3$ during closing after closing of $L_1$ and $L_2$ at a negative peak of phase-to-phase voltage $L_1$-$L_2$, it is not necessary to consider if the system was loaded or not during opening. The closing should however be made for a system without additional inductive load, e.g. an unloaded transformer.

Figure 8:
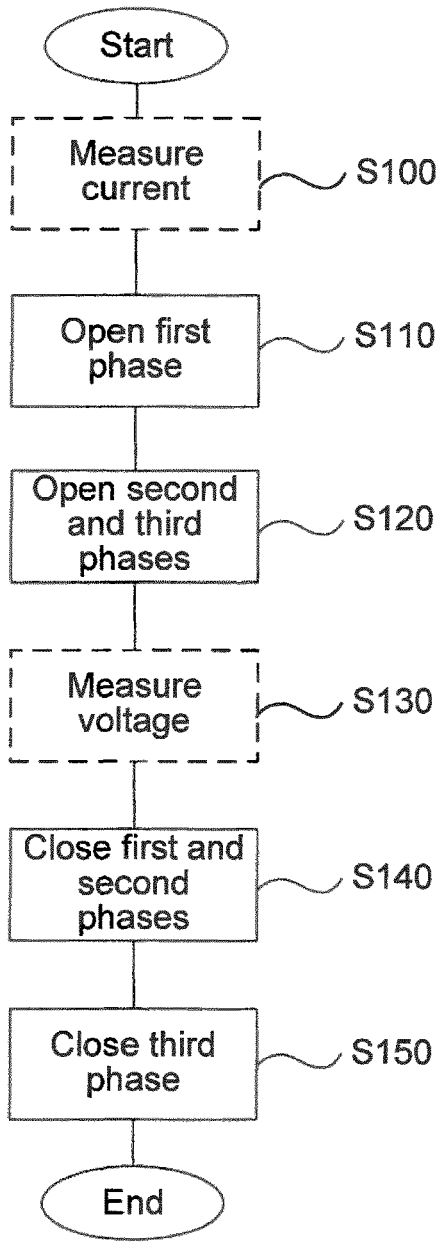
FIG. 8 is a flowchart illustrating a method for controlling a circuit breaker in a three-phase system.

A method for controlling a circuit breaker is presented with reference to FIG. 8. The circuit breaker is connected in a three-phase system having an inductive load and comprises opening S110 a first phase $L_1$ of the three-phase system before a zero crossing of a current in the first phase $L_1$, opening S120 the second and third phases $L_2$ and $L_3$ of the three-phase system a quarter period after opening the first phase $L_1$, closing S140 the first and second phase $L_1$ and $L_2$ at a peak voltage of a voltage between the first and second phases $L_1$ and $L_2$, and closing S150 the third phase $L_3$ a quarter period after closing the first and second phases $L_1$ and $L_2$. I.e., the order of closing the phases $L_1$-$L_3$ being dependent on the order of opening the phases $L_1$-$L_3$.

The quarter period in the opening step S120 and the closing step S150 is the theoretical optimal period, but in practical solutions it may vary to some degree.

The method may comprise measuring S100 the current in the first phase $L_1$, and measuring S130 the voltage $L_1$-$L_2$ between the first phase $L_1$ and the second phase $L_2$. By measuring a current in the first phase $L_1$, is meant that the current is measured directly or indirectly. I.e. the current may be measured directly in the first phase $L_1$, or the current of another phase is measured and adjusted for phase difference there between.

The method may comprise estimating the current in the first phase $L_1$ by measuring a phase voltage, and measuring S130 the voltage between the first phase $L_1$ and the second phase $L_2$.

The first phase $L_1$ may be opened a quarter period before the zero crossing of the current in the first phase $L_1$.

The first phase $L_1$ may be opened before a zero crossing towards a positive current in the first phase $L_1$, and wherein the first $L_1$ and second $L_2$ phases are closed at a negative peak voltage of phase-to-phase voltage $L_1$-$L_2$. Alternatively, the first phase $L_1$ may be opened before a zero crossing towards a negative current in the first phase $L_1$, and wherein the first $L_1$ and second $L_2$ phases are closed at a positive peak voltage of phase-to-phase voltage $L_1$-$L_2$.

A circuit breaker controller for a three-phase system is presented. The three-phase system has an inductive load and the circuit breaker controller comprises a circuit breaker controller configured to measure a first phase $L_1$ current in the three-phase system, open the first phase $L_1$ of the three-phase system, open a second and third phase $L_2$ and $L_3$ of the three-phase system after opening the first phase $L_1$, measure a phase-to-phase voltage between the first phase $L_1$ and the second phase $L_2$, close the first and second phase $L_1$ and $L_2$, and close the third phase $L_3$ after closing the first and second phases $L_1$ and $L_2$. I.e., the order of closing the phases $L_1$-$L_3$ being dependent on the order of opening the phases $L_1$-$L_3$.

The circuit breaker controller may be configured to open the first phase $L_1$ a quarter period before a zero crossing of the current in the first phase $L_1$.

The second $L_2$ and third $L_3$ phases may be opened a quarter period after opening of the first phase $L_1$, and wherein the third phase $L_3$ may be closed a quarter period after the first $L_1$ and second $L_2$ phases are closed.

The circuit breaker controller may comprise a processor, using any combination of one or more of a suitable central processing unit (CPU), multiprocessor, microcontroller, digital signal processor (DSP), application specific integrated circuit, and the like, capable of executing software instructions of a computer program stored in a memory. The memory can thus be considered to be or form part of a computer program product. The processor may be configured to execute a computer program stored therein to cause the circuit breaker controller to perform desired steps.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A method for controlling a circuit breaker, the circuit breaker being connected in a three-phase system having an inductive load, the method comprising:
    measuring the current in the first phase or estimating the current in the first phase by measuring a phase voltage;
    opening a first phase of the three-phase system before a zero crossing of a current in the first phase;
    opening the second and third phases of the three-phase system a quarter period after opening the first phase;
    measuring a phase-to-phase voltage between the voltage of the first phase and the voltage of the second phase;
    closing the first and second phase at a peak voltage of the phase-to-phase voltage; and
    closing the third phase a quarter period after closing the first and second phases,
    wherein the first phase is opened before a zero crossing towards a positive current in the first phase, and wherein the first and second phases are closed at a negative peak voltage of the phase-to-phase voltage during no load, or
    wherein the first phase is opened before a zero crossing towards a negative current in the first phase, and wherein the first and second phases are closed at a positive peak voltage of the phase-to-phase voltage during no load.

2. The method as claimed in claim 1, wherein the first phase is opened a quarter period before the zero crossing of the current in the first phase.

3. A circuit breaker controller for a three-phase system having an inductive load, the circuit breaker controller comprising:
    a circuit breaker controller configured to measure a first phase current in the three-phase system or estimate the current in the first phase by measuring a phase voltage, open the first phase of the three-phase system, open a second and third phase of the three-phase system a quarter period after opening the first phase; measure a phase-to-phase voltage between the first phase and the second phase, close the first and second phase at a peak voltage of the phase-to-phase voltage, and close the third phase a quarter period after closing the first and second phases,
    wherein the first phase is opened before a zero crossing towards a positive current in the first phase, and wherein the first and second phases are closed at a negative peak voltage of the (phase-to-phase voltage) during no load, or
    wherein the first phase is opened before a zero crossing towards a negative current in the first phase, and wherein the first and second phases are closed at a positive peak voltage of the (phase-to-phase voltage) during no load.

4. The circuit breaker controller as claimed in claim 3, wherein the first phase is opened a quarter period before a zero crossing of the current in the first phase.

* * * * *